United States Patent
Katkar et al.

(10) Patent No.: US 9,615,451 B2
(45) Date of Patent: *Apr. 4, 2017

(54) POROUS ALUMINA TEMPLATES FOR ELECTRONIC PACKAGES

(71) Applicant: Invensas Corporation, San Jose, CA (US)

(72) Inventors: Rajesh Katkar, San Jose, CA (US); Cyprian Emeka Uzoh, San Jose, CA (US); Belgacem Haba, Saratoga, CA (US); Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 55 days.

This patent is subject to a terminal disclaimer.

(21) Appl. No.: 14/887,674

(22) Filed: Oct. 20, 2015

(65) Prior Publication Data
US 2016/0044781 A1  Feb. 11, 2016

Related U.S. Application Data

(62) Division of application No. 13/797,355, filed on Mar. 12, 2013, now Pat. No. 9,226,396.

(51) Int. Cl.
*H05K 1/09* (2006.01)
*H05K 1/00* (2006.01)
(Continued)

(52) U.S. Cl.
CPC ......... *H05K 1/0306* (2013.01); *H01L 21/481* (2013.01); *H01L 21/486* (2013.01);
(Continued)

(58) Field of Classification Search
CPC .................. H05K 1/09; H05K 1/115
(Continued)

(56) References Cited

U.S. PATENT DOCUMENTS 5,144,536 A * 9/1992 Tsukada ............... H01L 21/4807
174/258
5,262,226 A 11/1993 Yoshida
(Continued)

OTHER PUBLICATIONS

S. Bandyopadhyay et al., "Electrochemically assembled quasi-periodic quantum dot arrays", Nanotechnology, vol. 7, 1996.
H.He and N.J. Tao, "Electrochemical Fabrication of Metal Nanowires", Encyclopedia of Nanoscience and technology, vol. 2, pp. 755-772, 2004.
(Continued)

*Primary Examiner* — Sherman Ng
(74) *Attorney, Agent, or Firm* — Lerner, David, Littenberg, Krumholz & Mentlik, LLP

(57) ABSTRACT

Interposers and methods of making the same are disclosed herein. In one embodiment, an interposer includes a region having first and second oppositely facing surfaces and a plurality of pores, each pore extending in a first direction from the first surface towards the second surface, wherein alumina extends along a wall of each pore; a plurality of electrically conductive connection elements extending in the first direction, consisting essentially of aluminum and being electrically isolated from one another by at least the alumina; a first conductive path provided at the first surface for connection with a first component external to the interposer; and a second conductive path provided at the second surface for connection with a second component external to the interposer, wherein the first and second conductive paths are electrically connected through at least some of the connection elements.

20 Claims, 5 Drawing Sheets

(51) Int. Cl.
| | |
|---|---|
| *H05K 1/16* | (2006.01) |
| *H05K 1/11* | (2006.01) |
| *H05K 7/10* | (2006.01) |
| *H05K 1/03* | (2006.01) |
| *H01L 23/498* | (2006.01) |
| *H01L 21/48* | (2006.01) |
| *H01L 23/13* | (2006.01) |
| *H05K 3/40* | (2006.01) |
| *H05K 3/42* | (2006.01) |

(52) U.S. Cl.
CPC ........ *H01L 23/13* (2013.01); *H01L 23/49827* (2013.01); *H05K 1/09* (2013.01); *H05K 1/112* (2013.01); *H05K 1/115* (2013.01); *H05K 3/4007* (2013.01); *H05K 3/42* (2013.01); *H01L 2224/16225* (2013.01); *H01L 2225/107* (2013.01); *H01L 2225/1023* (2013.01); *H01L 2924/15192* (2013.01); *H01L 2924/15311* (2013.01); *H01L 2924/15331* (2013.01); *H05K 2201/09545* (2013.01); *H05K 2201/10378* (2013.01); *H05K 2203/0323* (2013.01)

(58) Field of Classification Search
USPC .......................................... 174/255–257, 260
See application file for complete search history.

(56) References Cited

U.S. PATENT DOCUMENTS

| | | | |
|---|---|---|---|
| 2004/0017672 A1* | 1/2004 | Matsuda | H01L 23/13 |
| | | | 361/767 |
| 2004/0150979 A1* | 8/2004 | Lambertini | B82Y 20/00 |
| | | | 362/629 |
| 2005/0136609 A1 | 6/2005 | Mosley et al. | |
| 2005/0257821 A1* | 11/2005 | Ramanathan | H01L 23/38 |
| | | | 136/203 |
| 2006/0001179 A1* | 1/2006 | Fukase | H01L 23/147 |
| | | | 257/778 |
| 2006/0138394 A1* | 6/2006 | Den | B81B 1/002 |
| | | | 257/3 |
| 2006/0138664 A1 | 6/2006 | Ito et al. | |
| 2009/0056987 A1* | 3/2009 | Nomiya | H01L 21/4857 |
| | | | 174/255 |
| 2010/0294552 A1* | 11/2010 | Kobayashi | H01L 23/49827 |
| | | | 174/260 |
| 2011/0095419 A1 | 4/2011 | Horiuchi et al. | |
| 2011/0220404 A1 | 9/2011 | Yamasaki et al. | |
| 2013/0092424 A1* | 4/2013 | Masuda | H01R 43/007 |
| | | | 174/257 |

OTHER PUBLICATIONS

International Search Report and Written Opinion for Application No. PCT/US204/024950 dated Jul. 15, 2014.

* cited by examiner

POROUS ALUMINA TEMPLATES FOR ELECTRONIC PACKAGES

CROSS REFERENCE TO RELATED APPLICATION

The present application is divisional of U.S. patent application Ser. No. 13/797,355, filed Mar. 12, 2013, the disclosure of which is hereby incorporated herein by reference.

FIELD OF THE INVENTION

The present application describes an interposer such as that which can be incorporated into a microelectronic assembly which may include an unpackaged semiconductor die or packaged semiconductor die, as well as methods for making such interposer, which include alumina and/or aluminum features.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in interposers and methods of making interposers would be desirable.

BRIEF SUMMARY OF THE INVENTION

Interposers and methods of making the same are disclosed herein.

In one embodiment, an interposer comprises a region having first and second oppositely facing surfaces and a plurality of pores, each pore extending in a first direction from the first surface towards the second surface. Alumina may extend along a wall of each pore. A plurality of electrically conductive connection elements can extend in the first direction, the connection elements consisting essentially of aluminum and being electrically isolated from one another by at least the alumina extending along the walls of the pores. The interposer may include a first conductive path provided at the first surface for connection with a first component external to the interposer. The interposer may include a second conductive path provided at the second surface for connection with a second component external to the interposer. In one example, the first and second conductive paths are electrically connected through at least some of the connection elements.

In one embodiment, each pore may have a diameter of less than about 2 micrometers.

In one embodiment, the first and second conductive paths may be at least one of a plurality of contacts or a redistribution layer (RDL).

In one embodiment, the first conductive path may comprise a plurality of first contacts adjacent to the first surface for connection with a first component external to the interposer.

In one embodiment, the second conductive path may comprise a plurality of second contacts adjacent to the second surface for connection with a second component external to the interposer. In one example, at least some of the first contacts may be electrically connected with at least some corresponding second contacts through the connection elements.

In one embodiment, at least a portion of the interposer may have a heat spreader function.

In one embodiment, the interposer further comprises an aluminum region surrounding at least some of the connection elements and configured to provide a heat spreader function.

In one embodiment, at least some of the first conductive path may overlie some of the pores.

In one embodiment, no portion of the at least some first conductive path may overlie the connection elements.

In one embodiment, at least some of the first conductive path may be aligned with the connection elements.

In one embodiment, at least some of the pores may be disposed adjacent one another in annular patterns, and at least some of the annular patterns may encompass connection elements of the plurality of connection elements and the alumina extending along the walls of the pores of the at least some annular patterns electrically isolates respective connection elements from one another.

In one embodiment, at least some of the pores may incorporate voids.

In one embodiment, at least one connection element may occupy an area of the first surface which encompasses areas occupied by others of the connection elements, the at least one connection element configured as a heat spreader of the interposer.

In one embodiment, at least some of the pores may be at least partially filled with a dielectric material overlying the alumina.

In one embodiment, at least some of the pores may be at least partially filled with an electrically conductive material.

In one embodiment, the interposer comprises second connection elements extending in the first direction, each second connection element comprising an electrically conductive material extending within some of the plurality of pores, at least some of the first contacts being electrically connected with corresponding second contacts through the second connection elements.

In one embodiment, an interposer may comprises a region having first and second oppositely facing surfaces and a plurality of pores each extending in a first direction from the first surface towards the second surface. Alumina may extend along a wall of the each pore. A plurality of connection elements can extend in the first direction and be formed in some of the plurality of pores. Each connection element can comprise an electrically conductive material extending into one pore, the connection elements being electrically isolated from one another by at least the alumina extending along the walls of the pores. The interposer may include a first conductive path provided at the first surface for connection with a first component external to the interposer. The interposer may include a second conductive path provided at the second surface for connection with a second component external to the interposer. In one example, the first and second conductive paths may be electrically connected through at least some of the connection elements.

In one embodiment, each pore may have a diameter of less than 2 micrometers.

In one embodiment, the first and second conductive paths may be at least one of a plurality of contacts or a redistribution layer (RDL).

In one embodiment, the first conductive path may comprise a plurality of first contacts adjacent to the first surface for connection with a first component external to the interposer.

In one embodiment, the second conductive path may comprise a plurality of second contacts adjacent to the second surface for connection with a second component external to the interposer. In one example, at least some of the first contacts are electrically connected with at least some corresponding second contacts through the connection elements.

In one embodiment, at least some of the first conductive path may overlie some of the pores that do not include connection elements formed therein.

In one embodiment, no portion of the at least some of the first conductive path may overlie the connection elements.

In one embodiment, at least some of the first conductive path may be aligned with the connection elements.

In one embodiment, at least some of the pores may incorporate voids.

In one embodiment, some connection elements occupies an area of the first surface which encompasses areas occupied by others of the connection elements, the some connection elements configured as a heat spreader of the interposer.

In one embodiment, at least some of the remaining pores may be at least partially filled with a dielectric material overlying the alumina.

In one embodiment, at least some of the remaining pores may be at least partially filled with an electrically conductive material.

In one embodiment, a method of fabricating an interposer comprises forming a plurality of pores in a region consisting of aluminum, each pore extending in a first direction from a first surface of the region towards a second surface opposite the first surface. Alumina can extend along a wall of each pore, the forming performed such that portions of the region remain as a plurality of electrically conductive connection elements extending in the first direction, the connection elements consisting essentially of aluminum and being electrically isolated from one another by at least the alumina extending along the walls of the pores. The method may include forming a first conductive path at the first surface for connection with a first component external to the interposer. The method may include forming a second conductive path at the second surface for connection with a second component external to the interposer. In one example, the first and second conductive paths may be electrically connected through at least some of the connection elements.

In one embodiment, the first and second conductive paths may be at least one of a plurality of contacts or a redistribution layer (RDL).

In one embodiment, each pore may have a diameter of less than 2 micrometers.

In one embodiment, forming the first conductive path may comprise forming a plurality of first contacts adjacent to the first surface for connection with a first component external to the interposer.

In one embodiment, forming the second conductive path may comprise forming a plurality of second contacts adjacent to the second surface for connection with a second component external to the interposer. In one example, at least some of the first contacts may be electrically connected with at least some corresponding second contacts through the connection elements.

In one embodiment, the method comprises partially or fully filling at least some of the pores with a material.

In one embodiment, the material used to partially or fully fill the at least some pores may be at least one of a conductive or dielectric material.

In one embodiment, a method of fabricating an interposer comprises forming a plurality of pores in a region consisting of aluminum, each pore extending in a first direction from a first surface of the region towards a second surface opposite the first surface. Alumina can extend along a wall of each pore. The method can include forming a plurality of electrically conductive connection elements extending in the first direction by at least partially filling some of the plurality of pores with a conductive material, the connection elements being electrically isolated from one another by at least the alumina extending along the walls of the pores. The method can include forming a first conductive path at the first surface for connection with a first component external to the interposer. The method can include forming a second conductive path at the second surface for connection with a second component external to the interposer. In one example, the first and second conductive paths may be electrically connected through at least some of the connection elements.

In one embodiment, each pore can have a diameter of less than 2 micrometers.

In one embodiment, the first and second conductive paths may be at least one of a plurality of contacts or a redistribution layer (RDL).

In one embodiment, forming the first conductive path may comprise forming a plurality of first contacts adjacent to the first surface for connection with a first component external to the interposer.

In one embodiment, forming the second conductive path may comprise forming a plurality of second contacts adjacent to the second surface for connection with a second component external to the interposer. In one example, at least some of the first contacts may be electrically connected with at least some corresponding second contacts through the connection elements.

In one embodiment, the method may comprise partially or fully filling at least some of the remaining pores with a material, wherein the at least some of the pores do not include a conductive element formed therein.

In one embodiment, the material used to partially or fully fill the at least some remaining pores may be at least one of a conductive or dielectric material.

BRIEF DESCRIPTION OF THE DRAWINGS

FIG. 1-2 depicts a side schematic view of a microelectronic assembly in accordance with some embodiments of the present invention.

FIG. 1-3 depicts a side schematic view of a microelectronic assembly in accordance with some embodiments of the present invention.

FIG. 1-4 depicts a top down schematic view of a microelectronic assembly in accordance with some embodiments of the present invention.

FIG. 2-1 depicts a side schematic view of a template comprising porous alumina in accordance with some embodiments of the present invention.

FIG. 2-2 depicts a top down cross sectional view of a template comprising porous alumina in accordance with some embodiments of the present invention.

FIG. 2-3 depicts a top down cross sectional view of a template comprising porous alumina in accordance with some embodiments of the present invention.

FIG. 2-4 depicts an interposer in accordance with some embodiments of the present invention.

FIG. 2-5 depicts a top down view of an interposer in accordance with some embodiments of the present invention.

FIG. 3-1 depicts a side schematic view of a template comprising porous alumina in accordance with some embodiments of the present invention.

FIG. 3-2 depicts a side schematic view of an interposer in accordance with some embodiments of the present invention.

FIG. 3-3 depicts a top down cross sectional view of an interposer in accordance with some embodiments of the present invention.

DETAILED DESCRIPTION

Interposers and methods of making the same are disclosed herein. Specifically, an interposer and a method of making an interposer are described herein which incorporates porous alumina, e.g., a region having first and second oppositely facing surfaces and a plurality of pores, each pore extending in a first direction from the first surface towards the second surface and having alumina extending along the walls of the pores. Some embodiments provide interposers in which vertical interconnects therein may, in some examples, have aspect ratios greater than 5:1 and in some examples be greater than 10:1. Some embodiments may advantageously provide methods for making interposers that reduce the number of process steps, for example, such eliminating one or more of dielectric, barrier, seed, or metal deposition.

Figure 1:
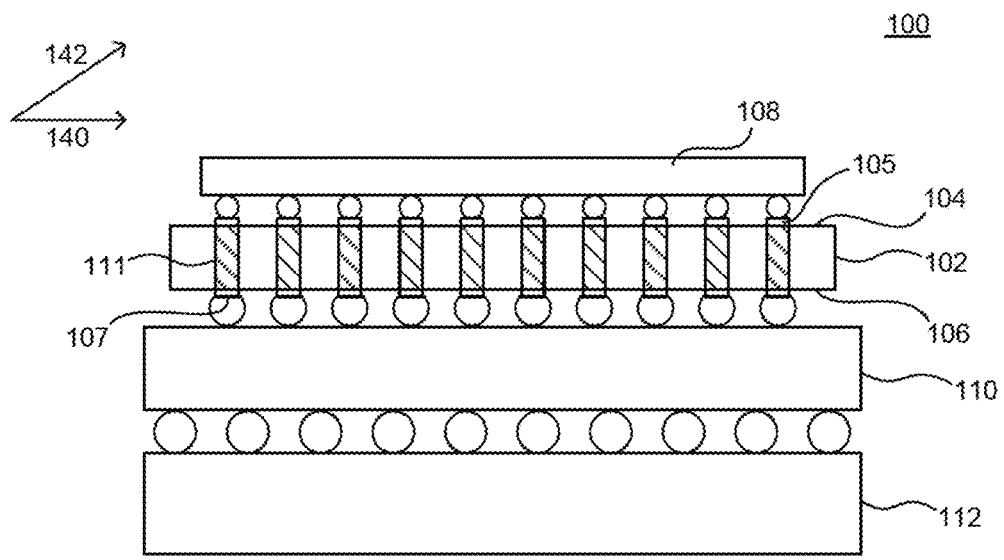
FIG. 1-1 depicts a side schematic view of a microelectronic assembly in accordance with some embodiments of the present invention.
Figures 1, 2:
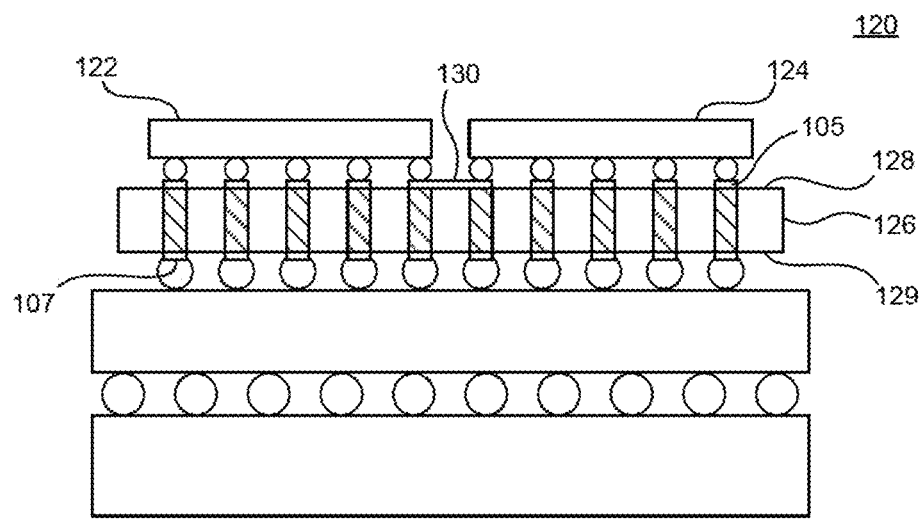
Figures 1, 2, 3:
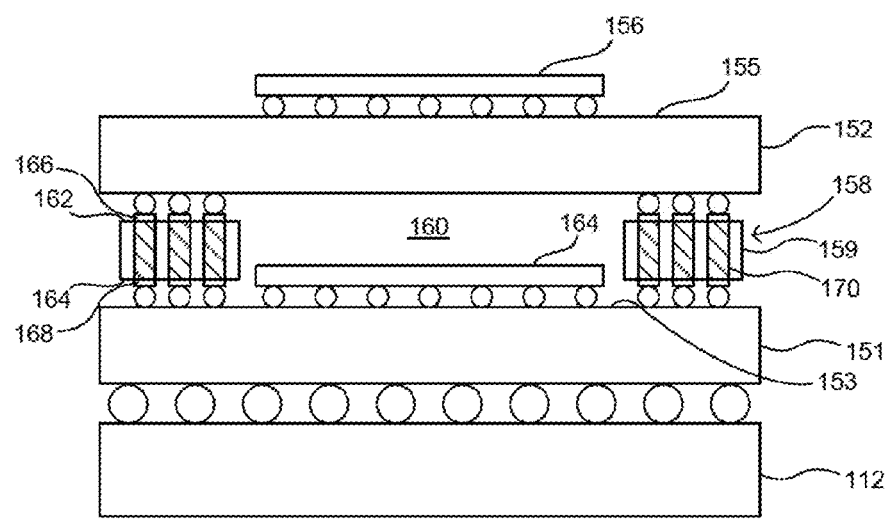

FIGS. 1-1 to 1-4 depict various embodiments of a microelectronic assembly including an interposer. For example, an interposer may have various forms, such as having a continuous surface 104 extending in lateral directions 140, 142, as depicted in FIGS. 1-1 and 1-2, 140 being in a direction depicted in the sectional view shown and 142 being in a direction along surface 104 but out of the plane of the depicted view. Alternatively, an interposer may include a frame region having a central aperture, such as depicted in FIG. 1-3 and FIG. 1-4. Other and further embodiments microelectronic assemblies including interposer, in additional to the exemplary embodiments depicted in FIGS. 1-1 to 1-3 are possible.

FIG. 1-1 depicts a microelectronic assembly 100 having an interposer 102 in accordance with some embodiments of the present invention. The interposer 102 may have first and second oppositely facing surfaces 104, 106, e.g., top and bottom surfaces, at which first and second contacts 105, 107, are exposed, respectively, for electrical connection with first and second components of the microelectronic assembly 100, respectively. As shown in FIG. 1-1, the first component can be a component having active circuit elements thereon, such as a microelectronic element 108, for example, and the component may have a face facing towards the first surface 104 of the interposer 102 at a first side thereof and connected to the first contacts 105 of the interposer 102. In one example, the microelectronic element 108 can be a packaged or unpackaged semiconductor die. As further shown in FIG. 1-1, the second contacts 107 of the interposer 102 can be electrically connected with corresponding contacts of another component of the assembly, such as a package substrate 110 in the example illustrated in FIG. 1-1. Connection elements 111 between the first and second contacts 105, 107 are provided and extend in a direction of a thickness of the interposer between the first and second surfaces 104, 106 of the interposer 102.

As an alternative to that shown in FIG. 1-1 or in addition thereto, some or all of the second contacts 107 may be connected with a second microelectronic element, which can be an unpackaged or packaged semiconductor die having a surface facing the second surface 106 of the interposer 102. The package substrate 110 or other component interconnected with the interposer 102 can, in turn be mounted to contacts of a circuit panel 112, as shown in FIG. 1-1.

FIG. 1-2 illustrates a microelectronic assembly 120 according to a further example in which first and second microelectronic elements 122, 124 can be electrically interconnected with an interposer 126 through first contacts 105 exposed at a first surface 128 of the interposer 126. The microelectronic elements 122, 124, which may be packaged or unpackaged, may be electrically interconnected with one another through conductive structure provided on the interposer, such as traces 130 thereon, which may extend in a direction parallel to the first and second surfaces 128, 129 of the interposer 126. In some cases, the traces 130 may overlie one or both of the first and second surfaces 128, 129, or may be partially or fully embedded within dielectric material at one or both surfaces. In one example, as shown in FIG. 1-2, an assembly including multiple microelectronic elements, which can be electrically interconnected with interposer 126 through first contacts 105, and may be further electrically interconnected with each other through traces 130.

FIG. 1-3 illustrates a microelectronic assembly 150 according to a further example in which vertically stacked, first and second package substrates 151, 152 having microelectronic element 154, 156, respectively disposed thereon, can be electrically interconnected with an interposer 158. As shown in FIGS. 1-3 and 1-4, the interposer 158 may have a frame region 159 or peripheral region that surrounds an aperture 160. The frame region may 159 may overly a first surface 153 of the first package substrate 151, the microelectronic element 154 electrically connected to the first package substrate 151 at the first surface 153. As shown in FIG. 1-3, the microelectronic element 154 can extend at least partly within aperture 160. The frame region may include first and second oppositely facing surfaces 162, 164 at which first and second contacts 166, 168 are respectively exposed. Connection elements 170 between the first and second contacts 162, 164 are provided and extend in a direction of a thickness of the frame region 159 between the first and second surfaces 162, 164. The first package substrate 151 may be electrically connected to the interposer 158 through the second contacts 107 at the second surface 164 of the frame region 159. The second package substrate 152 may be electrically connect to the interposer 158 through the first contacts 166 at the first surface 162 of the frame region 159. The second package substrate 152 may overly the first surface 162 of the frame region 159 and the central aperture 160. In one embodiment, the second package substrate 152 may be substantially similar to the first package substrate 151, the second package substrate 152 having the semiconductor die 156 electrically connected to the second package substrate 152 at a first surface 155 thereof. Alternatively, configurations and/or components of the package substrates 151, 152 may be different, or one or more additional components, such as an additional package substrate overlying package substrate 152 may be different from package substrates 151, 152.

FIG. 2 depicts an interposer in accordance with some embodiments of the present invention. As shown in FIG. 2-1, an interposer may be formed having a structure that includes aluminum and porous alumina. At the stage of processing illustrated in FIG. 2-1, a structure 200 may include first and second oppositely facing surfaces 202, 204 and a plurality of pores 206, each pore 206 extending in a first direction from the first surface 202 towards the second surface 204 wherein alumina 205 extends along a wall of each pore 206. As used herein, the term 'pore' means an opening that results from a process of oxidizing an aluminum region or layer, the process converting the aluminum (Al) along the walls of the openings into alumina ($Al_2O_3$). The process can be conducted such that the pores are sufficiently close to each other to cause the alumina regions that form along the walls of directly adjacent pores to merge together in one electrically isolating region. In one embodiment, as illustrated in FIG. 2-1, walls 207 of directly adjacent pores 206 can consist essentially of alumina. In one embodiment, walls of adjacent pores may include aluminum, where the aluminum is encompassed by the alumina 205 extending along the walls of each pore or otherwise isolated, such that it does not form an electrical connection with the connection elements 208 discussed below. The process is typically conducted such that each pore may have a diameter of less than about 2 micrometers, and which may be substantially smaller, e.g., ranging from about 100 nanometers to about two micrometers.

As shown in FIG. 2-1, the structure 200 may include a plurality of electrically conductive connection elements 208 extending in the first direction. The connection elements 208 may consist essentially of aluminum. The connection elements 208 may be electrically isolated from one another by at least the alumina 205 extending along the walls of the pores 206. For example, as illustrated in top down partial cross section view in FIG. 2-2, the structure 200 or at least a region thereof may consist essentially of pores, the alumina extending along the walls of each pore 206. Although illustrated as having a circular cross section in FIG. 2-2, the connection elements 208 may have any suitable cross section, such as non-circular, oblong, rectangular, or other suitable cross sections.

Alternatively, as illustrated in top down partial cross section view in FIG. 2-3, the structure 200 may have at least a region 211 thereof consisting essentially of aluminum. At least some of the pores 206 may be disposed adjacent one another in annular patterns 209, disposed within the surrounding region 211. In a particular example, such aluminum region 211 can be continuous and can extend throughout the same area that the structure 201 extends. At least some of the annular patterns 209 encompass connection elements 208 of the plurality of connection elements 208 and the alumina extending along the walls of the pores 206 of the at least some annular patterns 209 electrically isolates respective connection elements 208 from one another. Although illustrated as circular in FIG. 2-3, the annular pattern 209 may have any suitable annular shape, such as non-circular, oblong, rectangular, or the like. Although illustrated as a single layer of pores 206 in FIG. 2-3, the annular pattern 209 may include one or more layers of alumina-containing pores 206 surrounding each connection element 208 in directions parallel to surfaces 202, 204 of structure 200.

The interposer of the present invention may have a heat spreader function. In one embodiment, a region consisting essentially of aluminum, such as illustrated in FIG. 2-3, surrounding at least some of the connection elements 208 may be configured to provide the heat spreader function. An interposer of the present invention may include both embodiments as illustrated in FIGS. 2-2 and 2-3, or alternatively, a combination of the concepts from each embodiment. For example, as illustrated in FIG. 2-2, a region 210 consisting essentially of aluminum may be surrounding at least one or more connection elements 208. Region 210 can be disposed within a porous alumina region. The region 210 may provide a heat spreader function to an interposer of the present invention. The surrounding region 211 of aluminum seen in FIG. 2-3 can serve as a heat spreader in an interposer made from structure 200.

The structure 200 may be formed by a low cost, anodization process that can produce regular and anisotropic pores. In one embodiment, pore density may range from about $10^6$ to about $10^{12}$ per square centimeter ($cm^2$). In some embodiments, pores can be uniformly distributed and/or disordered in accordance with a desired pore diameter.

An exemplary method of fabricating the structure 200 can include electro-polishing a surface of a substrate consisting essentially of aluminum. Electro-polishing may be utilized to reduce surface roughness to about 100 nanometers or less. In one embodiment, to form the structure 200 illustrated in FIG. 2-2, a patterned mask layer may be applied to the electro-polished surface, the patterned mask layer overlying regions of the electro-polished surface where aluminum is to be preserved, such as the connection elements 208 and/or the region 210 and/or the aluminum regions 208, 211 as illustrated in FIG. 2-3. The substrate may then be electrolyzed using a acid solution, such as having a pH of less than about 5 to form the structure 200. One or more process variations may be possible, such as multi-step anodization processes to improve pore uniformity. A more complete description of anodization processes for forming a structure comprising porous alumina can be found in S. Bandyopadhyay et al., Nanotechnology, Vol. 7, 1996, which is incorporated herein by reference.

Figures 1, 2, 3, 4:
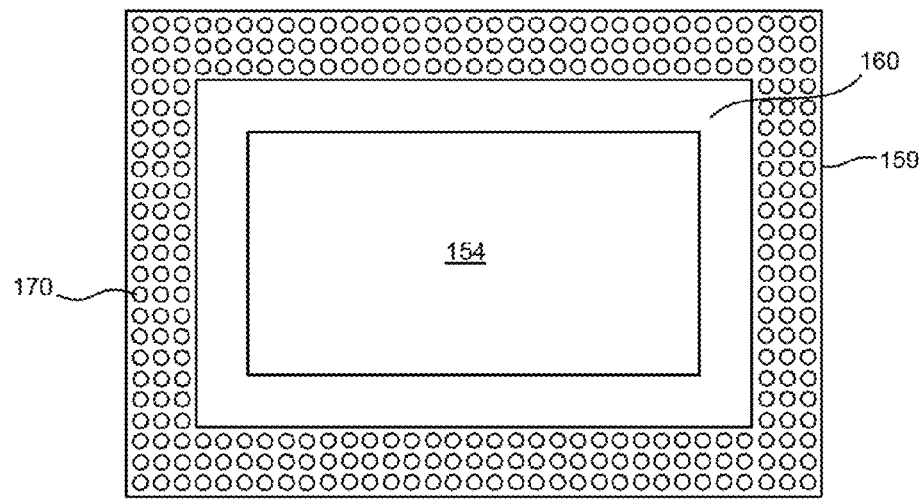
Figures 1, 2:
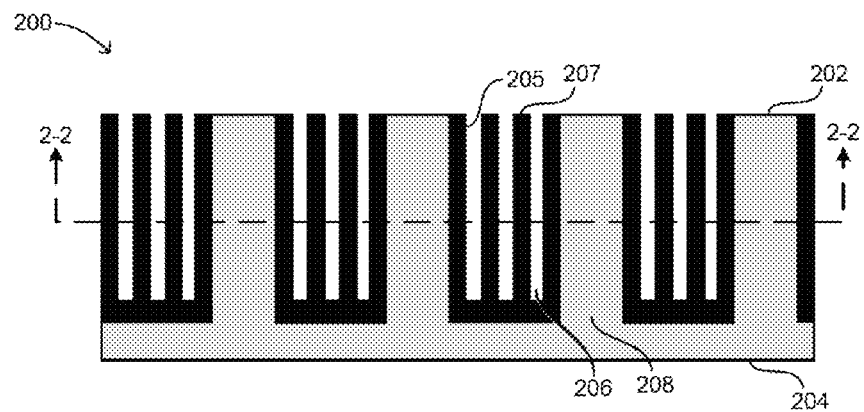
Figure 2:
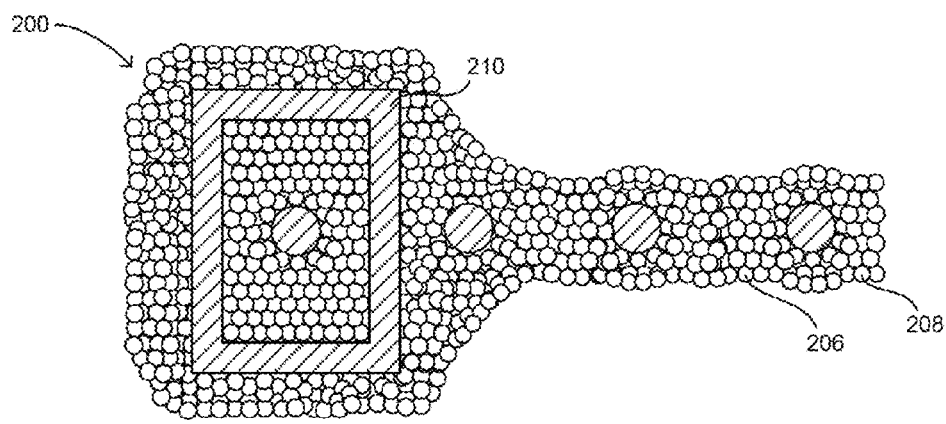
Figures 2, 3:
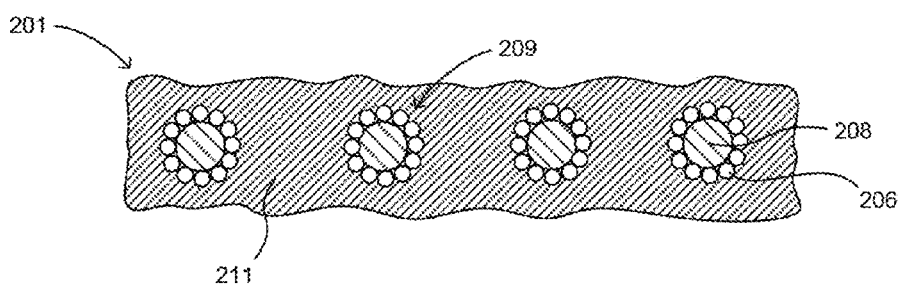
Figures 2, 3, 4:
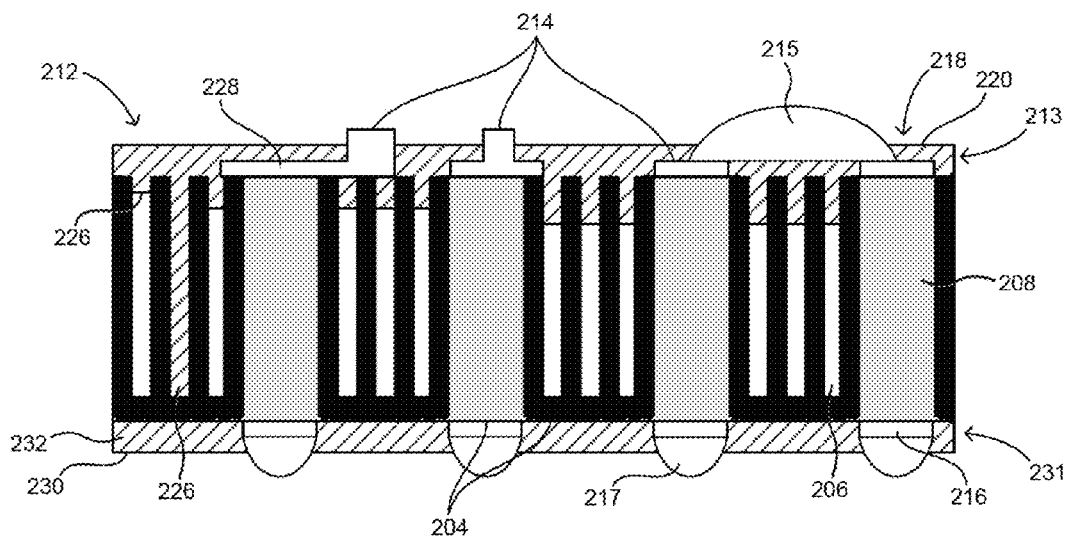
Figures 2, 3, 4, 5:
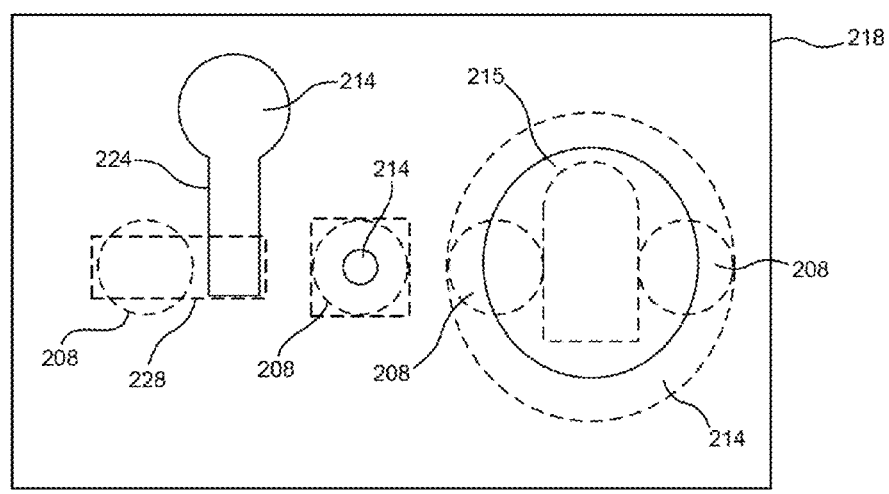
Figures 1, 3:
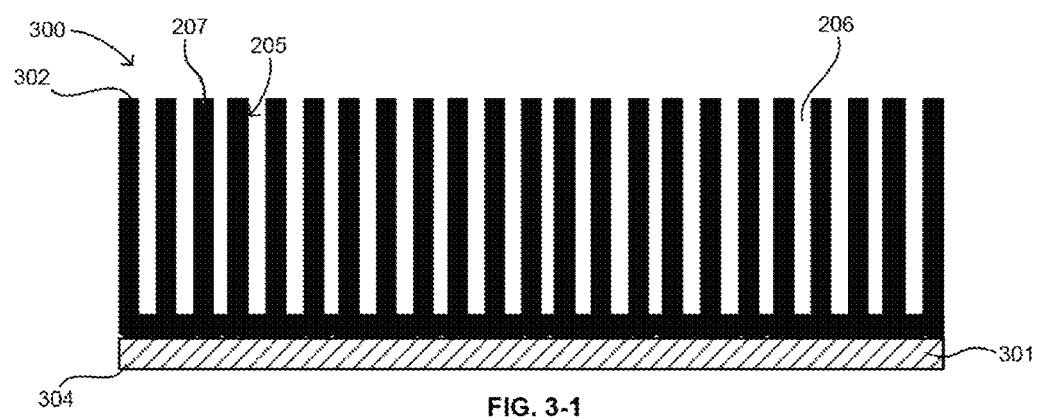
Figures 2, 3:
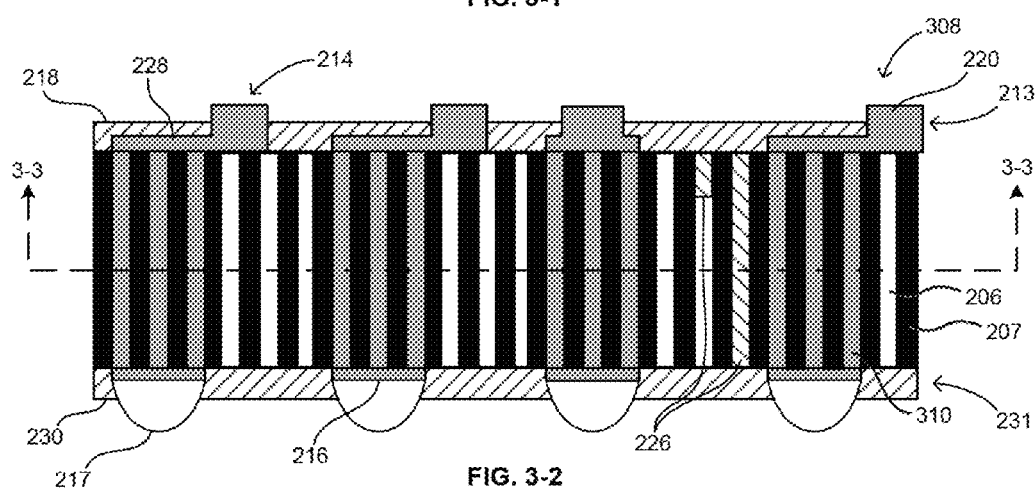
Figure 3:
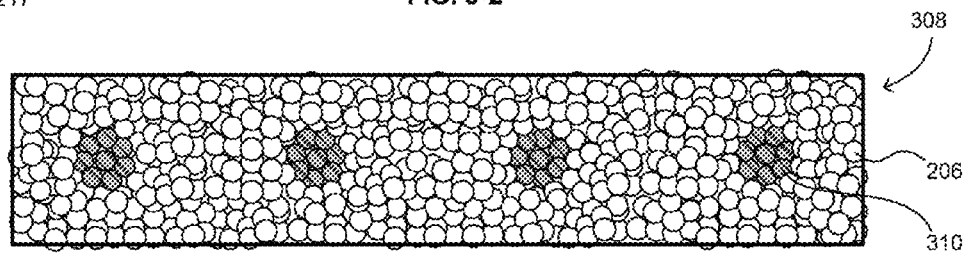

After formation of the structure 200, an interposer 212 may be formed from the structure 200. The interposer 212 is illustrated in FIG. 2-4. The interposer 212 may include a first conductive path 213 provided at the first surface 202 for connection with a first component external to the interposer 212. The interposer 212 may include a second conductive path 231 provided at the second surface 204. As shown in FIG. 2-4, the second surface 204 may be thinned until alumina at bottoms of pores 206 is exposed, prior to forming the second conductive path 231, as discussed herein. The first and second conductive paths 213, 231 may include any suitable components and/or methods known in the art, such as one or more of contacts, traces, micro vias, or the like. The first and second conductive paths may be included as part of one or more of a redistribution layer (RDL), a back end of line (BEOL) layer, or the like. It will be understood that an RDL and/or BEOL layer can include multiple layers. Further, although illustrated as having different structures in the interposer 212, the first and second paths 213 and 231 can be the same or different. The first and second conductive paths 213, 231 can include components formed from one or more of aluminum (Al), copper (Cu), alloys thereof, or other conductors.

The first conductive path 213 may include a plurality of first contacts 214 at the first surface 202 for connection with a first component external to the interposer 212. At least some of the first contacts 214 can be electrically connected with connection elements 208, either directly and extend through a dielectric region 218, or through elements extending through the dielectric region 218. The dielectric region 218 and the first contacts 214 may be formed by any suitable and dielectric processing. As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

As seen in FIG. 2-4, the dielectric region 218 may overlie or cap the pores 206. In one embodiment, as illustrated in FIG. 2-4, at least some of the pores 206 may be at least partially filled with a material 226. In one embodiment, the material 226 may be residual dielectric material resulting from deposition of the dielectric region 218. In one embodiment, the material 226 may be a non-conductive material, such as a dielectric material that may be the same as the dielectric material of the dielectric region 218 or a different dielectric material. In one embodiment, the material may be an electrically conductive material that may be used for heat spreader functions in the interposer 212. When at least some of the pores 206 are partially filled by the material 226 or not filled at all, the pores may incorporate voids. Alternatively, or in combination with, at least some of the pores 206 may be completely filled with the material 226.

The first contacts 214 may have various configurations at the first surface 202, and/or at a first surface 220 of the dielectric region 218 as illustrated in top down view of the interposer 212 in FIGS. 2-4 and 2-5. The first contacts may be aligned with, overlying, and/or not overlying the connection elements 208 and/or pores 206. For example, a solder ball 215 may be attached to one or more first contacts 214 which may be overlying a single connection element 208 or spanning adjacent connection elements 208. The first contact 214 may be a pad, overlying a connection element 208 or not overlying a connection element 208, such as electrically connected to a trace 224 that may extend along the first surface 220 of the dielectric element from a position overlying or adjacent to a connection element 208. The first contacts 214 may overlie some of the pores 206 or the connection elements 208. In one embodiment, at least some of the first contacts overlie some of the pores 206. In one embodiment, at least some of the first contacts 214 overlie the connection elements 208. In one embodiment, there can be first contacts 214 which do not overlie the connection elements 208.

The first contacts 214 may be electrically connected to at least one connection element 208 by at least one joining element 228 which may include a trace, via or combination thereof. For example, each joining element 228 may be disposed atop a corresponding connection element 208 at the first surface 202. The joining element may be of one or more suitable electrically conductive materials, such as a metal, a conductive compound of a metal, or a conductive material within a polymer matrix, for example.

The second conductive path 231 may include a plurality of second contacts 216 at the second surface 204 of the interposer 212. The second contacts 216 may have any suitable configuration, such as any of those configurations discussed above in accordance with the first contacts 214. The second contacts 216 can extend through a dielectric region 232 overlying the second surface 204, and/or be arranged at an exposed surface 230 of the dielectric region 232. As illustrated in FIG. 2-4, at least some of the first contacts 214 may be electrically connected with at least some corresponding second contacts 216 through the connection elements 208.

As shown in FIG. 2-4, the structure can be thinned from the second surface 204 until alumina at bottoms of pores 206 is exposed at the second surface 204. In one embodiment, the alumina can be used as a polish stop and an end point during removal of the material from the second surface 204. Similar to the first contacts 214, the second contacts 216 may be electrically connected to at least one connection element 208 or spanning adjacent connection elements 208, or connected to at least one connection element 208 by a joining element, such as a trace or the like. For example, a solder ball 217 may be attached to at least one second contacts 216 which may be overlying a single connection element 208.

Alternatively, or in combination with the interposer 212, other embodiments of an interposer using a structure comprising porous alumina are possible. For example, FIG. 3-1 illustrates a structure 300 comprising porous alumina. Where the template 300 has overlapping features with the structure 200, the same number labels are used. The structure 300 may include first and second oppositely facing surfaces 302, 304 and the plurality of pores 206, each pore 206 extending in a first direction from the first surface 302 towards the second surface 304 wherein alumina 205 extends along a wall of each pore 206. In one embodiment, as illustrated in FIG. 3-1, walls 207 of directly adjacent pores 206 can consist essentially of alumina. In one embodiment, walls of adjacent pores may include aluminum, where the aluminum is encompassed by the alumina 205 extending along the walls of each pore or otherwise isolated, such that it does not form an electrical connection with the connection elements 306 discussed below. Unlike the structure 200, which includes connection elements 308 integrated therewith, the structure 300 consists essentially of pores 206, and may have a base 301 consisting essentially of aluminum at the second surface 304.

An exemplary method of fabricating the structure 300 is similar to the method discussed above for forming the structure 200, except no patterned mask layer is used and connection elements are not formed as a result of the fabrication process.

After formation of the structure 300, an interposer 308 may be formed from the structure 300. The interposer 308 is illustrated in FIG. 3-2. The interposer 308 may include a plurality of connection elements 310 extending in the first direction by at least partially filling some of the plurality of pores with a conductive material. Each connection element 310 may comprise the conductive material at least partially filling one pore 206. The connection elements 310 may be electrically isolated from one another by at least the alumina extending along the walls of each pore 206. As depicted in FIG. 3-2 and in top down cross section view in FIG. 3-3 the connection elements 310 can be clustered in adjacent pores 206, for example, such as to for vias or other interconnect structures. This clustering of connection elements 310 is merely exemplary, and other configurations of the connection elements 310 within the interposer 308 are possible. For example, some connection elements 310 can occupies an area of the first surface 202 which encompasses areas occupied by others of the connection elements 310, such as in an embodiment similar to region 210. The some connection elements 310 can be configured as a heat spreader of the interposer.

As shown in FIG. 3-2, the interposer 308 may include first and second conductive paths 213, 231 similar to those described above relative to FIG. 2-4, and conductive elements connecting them with connection elements 310. The first and second conductive paths 213, 231 can include first contacts 214 and second contacts 216 similar to those described above relative to FIG. 2-4.

The dielectric region 218 shown in FIG. 3-2 may overlie or cap the pores 206. In one embodiment, as illustrated in FIG. 3-2, at least some of the remaining pores 206, such as those pores 206 not used to form connection elements 310, may be at least partially filled with a material 226 such as described above relative to FIG. 2-4.

As illustrated in FIG. 3-2, contacts 214 or contacts 216 can be electrically connected to several connection elements 310, which are formed in a cluster.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interposer, comprising:
a region having first and second oppositely facing surfaces and a plurality of pores each extending in a first direction from the first surface towards the second surface, and having alumina extending along a wall of the each pore,
a plurality of connection elements extending in the first direction and formed in some of the plurality of pores, each connection element comprising an electrically conductive material extending into one pore, the connection elements being electrically isolated from one another by at least the alumina extending along the walls of the pores;
a first conductive path provided at the first surface for connection with a first component external to the interposer; and
a second conductive path provided at the second surface for connection with a second component external to the interposer,
wherein the first and second conductive paths are electrically connected through at least some of the connection elements, and
at least some of the pores are disposed adjacent one another such that regions of the alumina which extend along the walls of directly adjacent pores are merged together in a common electrically isolating region surrounding and electrically isolating each of a plurality of the electrically conductive connection elements from one another.

2. The interposer of claim 1, wherein each pore has a diameter of less than 2 micrometers.

3. The interposer of claim 1, wherein the first and second conductive paths are at least one of a plurality of contacts or a redistribution layer (RDL).

4. The interposer of claim 1, wherein the first conductive path further comprises:
a plurality of first contacts adjacent to the first surface for connection with a first component external to the interposer; and
wherein the second conductive path further comprises:
a plurality of second contacts adjacent to the second surface for connection with a second component external to the interposer,
wherein at least some of the first contacts are electrically connected with at least some corresponding second contacts through the connection elements.

5. The interposer of claim 1, wherein at least some of the first conductive path is aligned with the connection elements.

6. The interposer of claim 1, wherein at least some of the pores that do not include connection elements formed therein incorporate voids.

7. The interposer of claim 1, wherein at least some of the remaining pores are at least partially filled with a dielectric material overlying the alumina.

8. The interposer of claim 1, wherein an aluminum region surrounds the common electrically isolating region, and the aluminum region is configured to provide a heat spreader function.

9. An interposer, comprising:
a region having first and second oppositely facing surfaces and a plurality of pores each extending in a first direction from the first surface towards the second surface, and having alumina extending along a wall of the each pore,
a plurality of connection elements extending in the first direction and formed in some of the plurality of pores, each connection element comprising an electrically conductive material extending into one pore, the connection elements being electrically isolated from one another by at least the alumina extending along the walls of the pores;
a first conductive path provided at the first surface for connection with a first component external to the interposer; and
a second conductive path provided at the second surface for connection with a second component external to the interposer,
wherein the first and second conductive paths are electrically connected through at least some of the connection elements, wherein at least some of the first conductive path overlies some of the pores that do not include connection elements formed therein.

10. The interposer of claim 9, wherein no portion of the at least some of the first conductive path overlies the connection elements.

11. The interposer of claim 9, wherein some connection elements occupy an area of the first surface which encompasses areas occupied by others of the connection elements, the some connection elements configured as a heat spreader of the interposer.

12. The interposer of claim 9, wherein at least some of the remaining pores are at least partially filled with an electrically conductive material.

13. The interposer of claim 9, wherein the first conductive path further comprises: a plurality of first contacts adjacent to the first surface for connection with a first component external to the interposer; and
wherein the second conductive path further comprises:
a plurality of second contacts adjacent to the second surface for connection with a second component external to the interposer,
wherein at least some of the first contacts are electrically connected with at least some corresponding second contacts through the connection elements.

14. The interposer of claim 9, wherein an aluminum region surrounds the common electrically isolating region, and the aluminum region is configured to provide a heat spreader function.

15. A method of fabricating an interposer, comprising:
forming a plurality of pores in a region consisting of aluminum, each pore extending in a first direction from a first surface of the region towards a second surface opposite the first surface, wherein alumina extends along a wall of each pore;
forming a plurality of electrically conductive connection elements extending in the first direction by at least partially filling some of the plurality of pores with a conductive material, the connection elements being electrically isolated from one another by at least the alumina extending along the walls of the pores;
forming a first conductive path at the first surface for connection with a first component external to the interposer; and
forming a second conductive path at the second surface for connection with a second component external to the interposer,
wherein the first and second conductive paths are electrically connected through at least some of the connection elements.

16. The method of claim 15, wherein each pore has a diameter of less than 2 micrometers.

17. The method of claim 15, wherein the first and second conductive paths are at least one of a plurality of contacts or a redistribution layer (RDL).

18. The method of claim 15, wherein forming the first conductive path further comprises:
forming a plurality of first contacts adjacent to the first surface for connection with a first component external to the interposer; and
wherein forming the second conductive path further comprises:
forming a plurality of second contacts adjacent to the second surface for connection with a second component external to the interposer,
wherein at least some of the first contacts are electrically connected with at least some corresponding second contacts through the connection elements.

19. The method of claim 15, further comprising:
partially or fully filling at least some of the remaining pores with a material, wherein the at least some of the pores do not include a conductive element formed therein.

20. The method of claim 19, wherein the material used to partially or fully fill the at least some of the remaining pores is at least one of a conductive or dielectric material.

* * * * *